US012764949B2

(12) United States Patent
Chen

(10) Patent No.: US 12,764,949 B2
(45) Date of Patent: Oct. 13, 2026

(54) SEMICONDUCTOR MEMORY DEVICE AND METHOD FOR FORMING THE SAME

(71) Applicant: Winbond Electronics Corp., Taichung City (TW)

(72) Inventor: Frederick Chen, Tainan City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 575 days.

(21) Appl. No.: 18/338,900

(22) Filed: Jun. 21, 2023

(65) Prior Publication Data

US 2024/0431099 A1 Dec. 26, 2024

(51) Int. Cl.

| | |
|---|---|
| ***H10D 30/67*** | (2025.01) |
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10D 30/01*** | (2025.01) |
| ***H10D 30/43*** | (2025.01) |

(Continued)

(52) U.S. Cl.

CPC ............. *H10B 41/27* (2023.02); *H10B 41/10* (2023.02); *H10B 43/10* (2023.02); *H10B 43/27* (2023.02); *H10D 30/014* (2025.01); *H10D 30/43* (2025.01); *H10D 30/6735* (2025.01); *H10D 30/6757* (2025.01); *H10D 62/121* (2025.01); *H10W 20/42* (2026.01); *H10W 20/435* (2026.01)

(58) Field of Classification Search

CPC ........ H10B 41/27; H10B 41/10; H10B 43/10; H10B 43/27; H10B 41/30; H10B 43/30; H10D 30/014; H10D 30/43; H10D 30/6735; H10D 30/6757; H10D 62/121; H10D 30/019; H10D 30/501; H10W 20/42; H10W 20/435; B82Y 10/00

See application file for complete search history.

(56) References Cited

U.S. PATENT DOCUMENTS

| | | |
|---|---|---|
| 8,026,521 B1 | 9/2011 | Or-Bach et al. |
| 8,630,114 B2 | 1/2014 | Lue |

(Continued)

FOREIGN PATENT DOCUMENTS

| | | | |
|---|---|---|---|
| CN | 4261889 * | 1/2021 | ........... H01L 27/108 |
| TW | 202320162 A | 5/2023 | |

OTHER PUBLICATIONS

Sim et al. Gate All around with Back Gate NAND Flash Structure. Electronics, MDPI, 2021, pp. 1-6 (Year: 2021).*

(Continued)

*Primary Examiner* — Galina G Yushina

(74) *Attorney, Agent, or Firm* — MUNCY, GEISSLER, OLDS & LOWE, P.C.

(57) ABSTRACT

A semiconductor memory device includes a plurality of nanowires vertically stacked over a substrate, and a plurality of memory films wrapping around the plurality of nanowires, respectively. Each of the memory films includes a first oxide layer, a nitride layer and a second oxide layer sequentially formed over the corresponding nanowire. The semiconductor memory device also includes a gate electrode layer surrounding the plurality of memory films, and an isolation structure encapsulating the gate electrode layer. The isolation structure is in direct contact with the gate electrode layer and the nitride layers of the memory films.

19 Claims, 16 Drawing Sheets

(51) Int. Cl.

| | |
|---|---|
| ***H10D 62/10*** | (2025.01) |
| ***H10W 20/41*** | (2026.01) |
| ***H10W 20/42*** | (2026.01) |

(56) References Cited

U.S. PATENT DOCUMENTS

| | | | | |
|---|---|---|---|---|
| 2018/0102375 | A1* | 4/2018 | Pang | H10B 41/10 |
| 2020/0066741 | A1* | 2/2020 | Wu | G11C 16/14 |
| 2022/0013532 | A1 | 1/2022 | Young et al. | |
| 2022/0122975 | A1* | 4/2022 | Ryu | H10D 62/121 |
| 2024/0008241 | A1* | 1/2024 | Liaw | H10B 10/125 |
| 2024/0405089 | A1* | 12/2024 | Ye | H10D 84/038 |

OTHER PUBLICATIONS

Barraud et al. 3D RRAMs with Gate-All-Around Stacked Nanosheet Transistors for In-Memory-Computing, 2020 IEEE International Electron Devices Meeting, pp. 645-648 (Year: 2020).*

* cited by examiner

SEMICONDUCTOR MEMORY DEVICE AND METHOD FOR FORMING THE SAME

BACKGROUND

Field of the Disclosure

The present disclosure relates to a semiconductor memory device, and in particular, it relates to flash memory with a three-dimensional structure.

Description of the Related Art

A flash memory with a three-dimensional structure in which an array of memory cells is stacked in a direction perpendicular to the main surface of the substrate is needed to improve the integration of memory cells.

SUMMARY

The semiconductor memory device includes a plurality of nanowires vertically stacked over a substrate, and a plurality of memory films wrapping around the plurality of nanowires, respectively. Each of the memory films includes a first oxide layer, a nitride layer and a second oxide layer sequentially formed over the corresponding nanowire. The semiconductor memory device also includes a gate electrode layer surrounding the plurality of memory films, and an isolation structure encapsulating the gate electrode layer. The isolation structure is in direct contact with the gate electrode layer and the nitride layers of the memory films.

The semiconductor memory device includes a first column of memory transistors stacked in a vertical direction. Each of the memory transistors in the first column includes at least two nanowires, and the nanowires of the memory transistors are stacked in respective levels. The semiconductor memory device also includes a second column of drain lines stacked in the respective levels in the vertical direction. The drain lines in the second column are divided into groups, each of the groups of drain lines includes at least two drain lines that are electrically coupling to the at least two memory nanowires of the corresponding memory transistor. The semiconductor memory device also includes a plurality of conductive vias landing on the groups of drain lines, respectively. The least two drain lines in each group are electrically connected to each other through the corresponding conductive via.

The method of forming a semiconductor memory device includes forming a stack of alternating channel layers and sacrificial layers. The stack includes a first strip region, a second strip region and a connecting region connecting the first strip region and the second strip region. The method also includes removing portions of the sacrificial layers in the connecting region, forming a memory film to surround portions of the channel layers in the connecting region, forming a gate electrode layer to surround the memory film, and removing portions of the sacrificial layers in the first strip region and the second strip region to form gaps exposing the memory film. The method also includes partially removing, from the gaps, the memory film, and replacing portions of the channel layers in the first strip region and the second strip region with a plurality of conductive lines.

BRIEF DESCRIPTION OF THE DRAWINGS

In accordance with some embodiments of the present disclosure, it can be further understood by reading the subsequent detailed description and examples with references made to the accompanying drawings, wherein:

FIG. 3A, FIG. 3B, FIGS. 3C-1 to 3C-3, FIGS. 3D-1 to 3D-3, FIGS. 3E-1 to 3E-3, FIGS. 3F-1 to 3F-3, FIGS. 3G-1 and 3G-2, FIGS. 3H-1 and 3H-2, FIGS. 3I-1 and 3I-2, FIGS. 3J-1 and 3J-2, FIGS. 3K-1 to 3K-3, FIG. 3L, FIG. 3M, FIG. 3N and FIG. 3O are schematic diagrams illustrating the formation of a three-dimensional semiconductor memory device at various intermediate stages, in accordance with some embodiments.

FIGS. 4A-1 to 4A-3, FIGS. 4B-1 and 4B-2 and FIGS. 4C-1 to 4C-3 are schematic diagrams illustrating the formation of a three-dimensional semiconductor memory device at various intermediate stages, in accordance with some embodiments.

DETAILED DESCRIPTION

Figure 1:
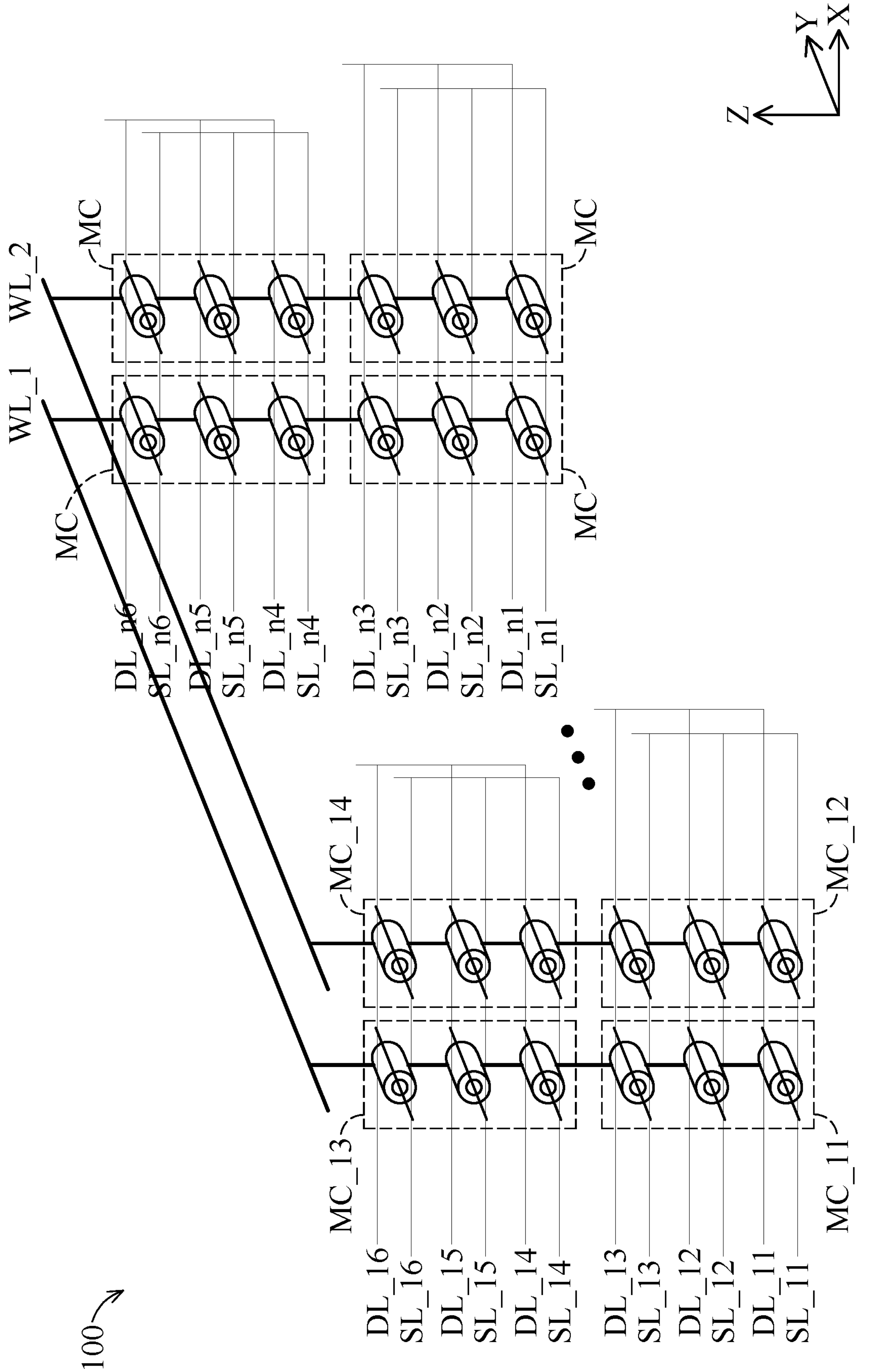
FIG. 1 is a schematic diagram illustrating the circuit of a three-dimensional semiconductor memory device, in accordance with some embodiments.

FIG. 1 is a schematic diagram illustrating the circuit of a semiconductor memory device 100 with a three-dimensional structure, in accordance with some embodiments. In some embodiments, the semiconductor memory device 100 may be a non-volatile storage device such as a flash memory device, e.g., a NOR-type flash memory device with a three-dimensional structure. The semiconductor memory device 100 includes a memory cell array, word lines WL (e.g., WL_1 and WL_2), source lines SL (e.g., SL_11 to SL_16 and SL_n1 to SL_n6) and drain lines DL (e.g., DL_11 to DL_16 and DL_n1 to DL_n6).

For a better understanding of the semiconductor structure 100, X-Y-Z coordinate reference is provided in the figures of the present disclosure. The X-axis and the Y-axis are generally oriented along the lateral (or horizontal) directions that are parallel to the main surface of the substrate. The Y-axis is transverse (e.g., substantially perpendicular) to the X-axis. The Z-axis is generally oriented along the vertical direction that is perpendicular to the main surface of the substrate (or the X-Y plane).

The memory cell array includes a plurality of memory cells MC (e.g., MC_11, MC_12, MC_13 and MC_14). Each of the memory cells MC includes a memory transistor. The memory transistors are gate-all around transistors (GAA). In some embodiments, the memory transistor of each of the memory cells MC includes at least two nanowires, e.g., 2-6. For example, the memory cells MC each includes three nanowires, as shown in FIG. 1. Although nanowires are illustrated in FIG. 1, the memory transistor may include any applicable nanostructures, e.g., nanosheets, nanotubes, etc.

The semiconductor memory device 100 includes a multi-level (or multi-layer) structure. The nanowires of the memory cells MC, the source lines SL and the drain lines DL are arranged in each level (in the X-Y plane) of the multi-level structure. These levels are arranged in the Z direction.

For example, the source lines SL_11, the drain line DL_11, and nanowires between the source lines SL_11 and the drain line DL_11, the source lines SL_n1, the drain line DL_n1, and nanowires between the source lines SL_n1 and the drain line DL_n1 are located in the first level (i.e., the bottommost level). The source lines SL_12, the drain line DL_12, and nanowires between the source lines SL_12 and the drain line DL_12, the source lines SL_n2, the drain line DL_n2, and nanowires between the source lines SL_n2 and the drain line DL_n2 are located in the second level (i.e., second bottommost level).

As a result, each of the memory cells MC may be located in at least two levels (e.g., in three levels, as shown in FIG. 1). On the other hand, the memory cells MC of the semiconductor memory device 100 are arranged in multiple columns (in X-Z plane). For example, the memory cells MC_11, MC_12, MC_13 and MC_14 are arranged in a column.

The source lines SL and the drain lines DL extend in the X direction. The source lines SL are arranged in multiple columns, and the drain lines DL are arranged in multiple columns. For example, the source lines SL_11 to SL_16 are arranged in a column, and the drain lines DL_11 to DL_16 are arranged in another column. The columns of the source lines SL and the columns of drain lines DL are arranged alternatingly in the Y direction, and each column of memory cells MC is disposed between a corresponding column of source lines SL and a corresponding column of drain lines DL.

For each memory cell MC, the source terminal of the memory transistor is electrically coupled to vertically grouped source lines SL, and the drain terminal of the memory transistor is electrically coupled to vertically grouped drain lines DL. The source lines SL in each group are electrically connected to each other, and the drain lines DL in each group are electrically connected to each other. The number of source lines SL or drain lines DL in one group is the same as the number of nanowires in the corresponding memory cell that are electrically coupled thereto.

For example, the source terminal of the memory transistor of the memory cell MC_11 is electrically coupled to a group of the source lines SL_11, SL_12 and SL_13. The source lines SL_11, SL_12 and SL_13 are electrically connected to each other, e.g., through a conductive via. Similarly, the drain terminal of the memory transistor of the memory cell MC_11 is electrically coupled to a group of the drain lines DL_11, DL_12 and DL_13. The drain lines DL_11, DL_12 and DL_13 are electrically connected to each other, e.g., through a conductive via.

In addition, the memory cells MC located in the same column and the same levels share the same group of source lines SL and the same group of drain lines DL. For example, the memory cells MC_11 and MC_12 share the group of source lines SL_11, SL_12 and SL_13 and the group of drain lines DL_11, DL_12 and DL_13.

The word lines WL extend in the Y direction. In some embodiments, the word lines WL are located above the memory cell array, the source lines SL and the drain lines DL. The word lines WL are arranged in the topmost level of the multi-level structure. In some other embodiments, the word lines WL may be arranged in the bottommost level of the multi-level structure, and located under the memory cell array, the source lines SL and the drain lines DL. The gate terminals of the memory transistors of the memory cells are electrically coupled to the corresponding word lines WL.

As the semiconductor memory device continues to shrink, the gate length will be limited for hot carrier injection. Specifically, lower gate length tends to have electron velocity overshoot, and thus fewer lattice collisions to heat the electrons. Therefore, there are fewer opportunities for carriers to scatter and inject into the memory films and/or floating gates of the memory cells.

Since the nanowires can provide more boundaries, the collision opportunities for carriers scattering and injecting into the memory film and/or floating gate may are increased. Therefore, the GAA architecture may facilitate the continuous scaling of the semiconductor memory device.

However, as the nanowire size (e.g., diameter) shrinks, the on-state current may decrease drastically. In accordance with the embodiments of the present disclosure, one memory cell includes at least two nanowires, thereby increasing the on-state current, which may increase the operation speed.

Figure 2:
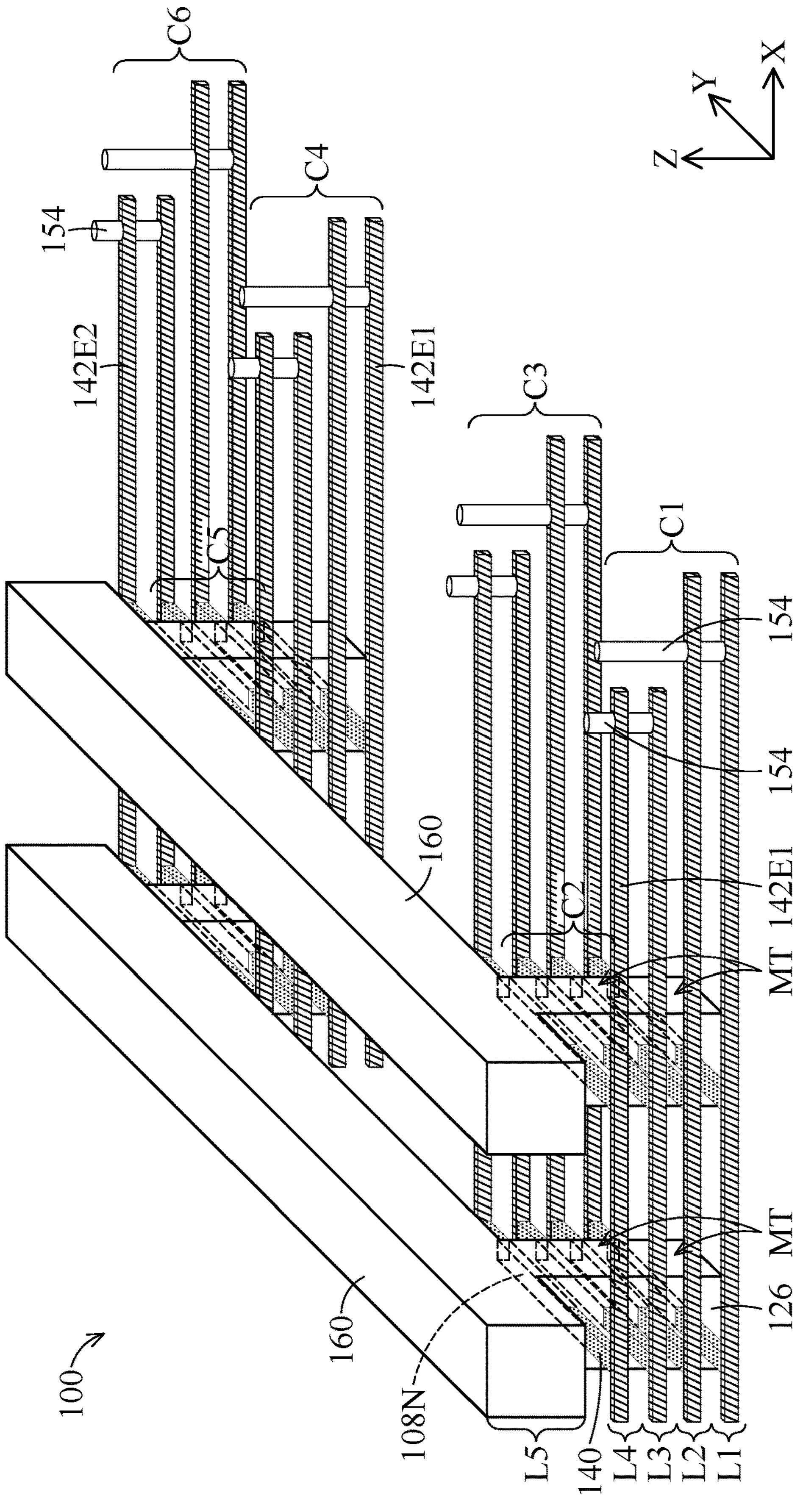
FIG. 2 is a perspective view illustrating a three-dimensional semiconductor memory device, in accordance with some embodiments.

FIG. 2 is a perspective view illustrating a semiconductor memory device 100 with a three-dimensional structure, in accordance with some embodiments. The semiconductor memory device 100 shown in FIG. 2 may be the semiconductor memory device discussed above in FIG. 1. The semiconductor memory device 100 is formed over a substrate (not shown). The semiconductor memory device 100 includes a multi-level structure in which levels L1-L5 are vertically stacked in the Z direction. Although FIG. 2 only illustrates five levels, the semiconductor memory device 100 may include more than five levels, e.g., 6-100.

The semiconductor memory device 100 includes memory transistors MT, conductive lines 142E1 and 142E2, conductive lines 160, and conductive vias 154. The memory transistors MT function as the memory cells MC as discussed in FIG. 1. The memory transistors MT include nanowires 108N, gate structures 126 and source/drain regions 140. The nanowires 108N are arranged in the levels L1-L4. Each of the memory transistors MT includes least two nanowires 108N in neighboring levels. For example, the memory transistors MT each includes two nanowires 108N in levels L1 and L2 or two nanowires 108N in levels L3 and L4. The nanowires 108N are also arranged in multiple columns (e.g., C2 and C5).

The gate structures 126 include memory films wrapping around each nanowire 108N and a gate electrode layer surrounding the memory films. Each of the memory films includes an oxide-nitride-oxide (ONO) structure and may trap the carriers to provide access to data in the memory cell. In some other embodiments, the memory films may include further metal layers that function as floating gates. The source/drain regions 140 are sandwiched between and in direct contact with the nanowires 108N and the conductive lines 142E1 and 142E2. The source/drain regions 140 may be made of doped semiconductor material (such as silicon) with n-type or p-type dopants.

The conductive lines 142E1 and 142E2 extend in the X direction. The conductive lines 142E1 and 142E2 are arranged in the levels L1-L4. The conductive lines 142E1 are the source lines SL as discussed in FIG. 1, and the conductive lines 142E2 are the drain lines DL as discussed in FIG. 1. Each of the memory transistor MT is electrically coupled to the corresponding group of conductive lines 142E1 and the corresponding group of conductive lines 142E2. The conductive lines 142E1 are also arranged in multiple columns (e.g., C1 and C4), and the conductive lines 142E2 are also arranged in multiple columns (e.g., C3 and C6). In some embodiments, the conductive lines 142E1 and 142E2 are metal layers.

The conductive lines 142E1 are divided into several groups, the conductive lines 142E1 in each group are electrically connected to each other through a conductive via 154. Similarly, the conductive lines 142E2 are divided into several groups, the conductive lines 142E2 in each group are electrically connected to each other by a conductive via 154.

For example, the conductive lines 142E1 in the column C1 of the levels L1 and L2 are in the same group and are electrically connected to each other, and the conductive lines 142E1 in the column C1 of the levels L3 and L4 are in the same group and are electrically connected to each other. the conductive lines 142E2 in the column C3 of the levels L1 and L2 are in the same group and are electrically connected to each other, and the conductive lines 142E2 in the column C3 of the levels L3 and L4 are in the same group and are electrically connected to each other. The number of source lines SL or drain lines DL in one group is the same as the number of nanowires 108N of the corresponding memory transistor MT that is electrically coupled thereto.

The conductive vias 154 each land on the corresponding groups of conductive lines 142E1 and the corresponding groups of conductive lines 142E2. Each of the conductive vias 154 may penetrate through all conductive lines (142E1 or 142E2) in a group. In some embodiments, the conductive vias 154 are made of conductive material (e.g., metal).

The conductive vias 154 each land on the corresponding groups of conductive lines 142E1 and the corresponding groups of conductive lines 142E2. Each of the conductive vias 154 penetrates through all conductive lines (142E1 or 142E2) in a group. In some embodiments, the conductive vias 154 are made of conductive material (e.g., metal).

The semiconductor memory device 100 further includes an isolation structure (not shown) to encapsulate the memory transistors MT, the conductive lines 142E1 and 142E2, the conductive lines 160, and conductive vias 154 and fill the remaining space of the semiconductor memory device 100. The isolation structure may include more than one dielectric layers.

Figure 3A:
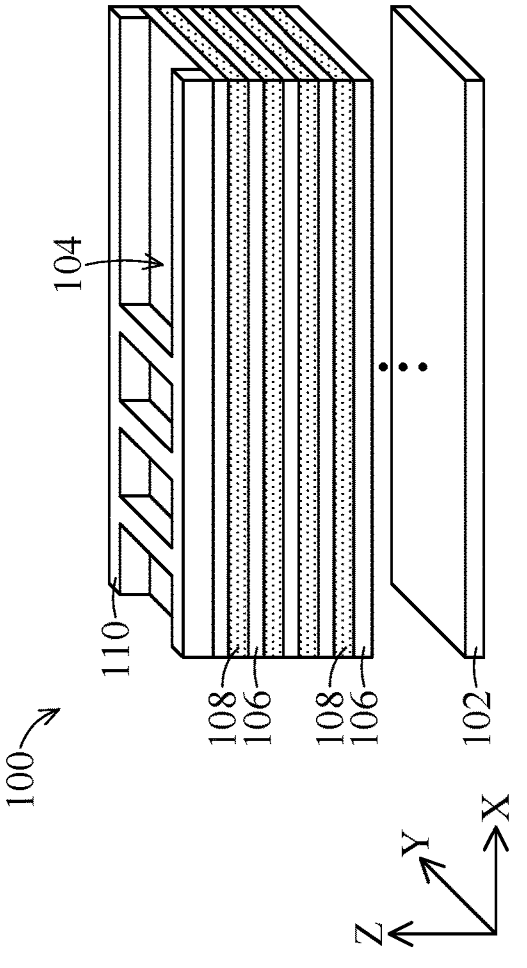

The method for forming the semiconductor memory device 100 is discussed below. FIGS. 3A through 3O are schematic diagrams illustrating the formation of the semiconductor memory device 100 at various intermediate stages.

Figure 3B:
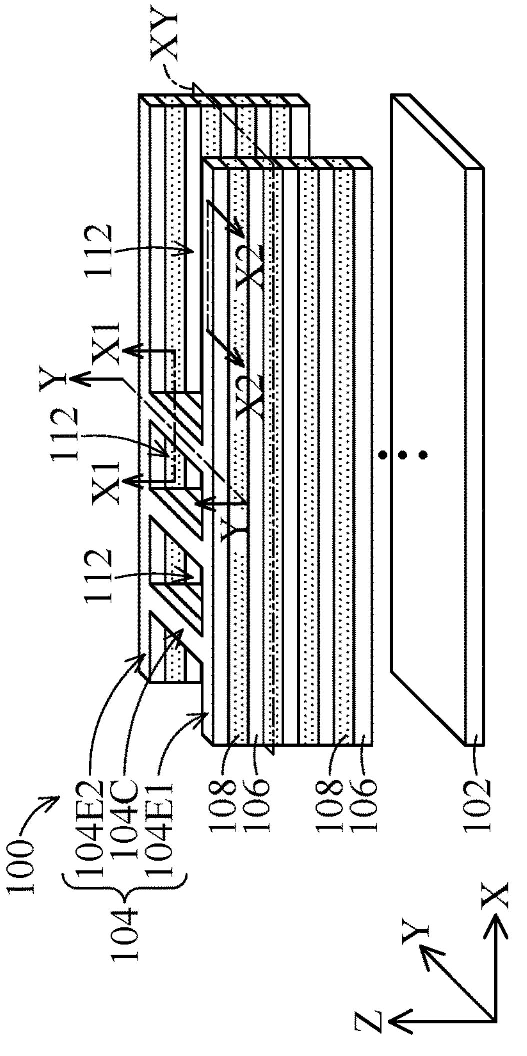

FIGS. 3A and 3B illustrate perspective views of the three-dimensional semiconductor memory device 100. The figures ending with "-1" (e.g., FIG. 3C-1) are plane views of the semiconductor memory device 100 corresponding to plane XY in FIG. 3B. The figures ending with "-2" (e.g., FIG. 3C-2) are cross-sectional views of the semiconductor memory device 100 corresponding to cross-section Y-Y in FIG. 3B. The figures ending with "-3" (e.g., FIG. 3C-3) are cross-sectional views of the semiconductor memory device 100 corresponding to cross-section X1-X1 in FIG. 3B.

The semiconductor memory device 100 includes a substrate 102 and a stack 104 formed over the substrate 102, as shown in FIG. 3A. The substrate 102 may be or includes a semiconductor substrate (e.g., Si substrate). The stack 104 is a multi-level structure and includes alternating sacrificial layers 106 and channel layers 108. The sacrificial layers 106 may be made of dielectric material such as silicon oxide (SiO), silicon nitride (SiN), silicon oxynitride (SiON), or a combination thereof. The channel layers 108 may be made of semiconductor material (such as silicon).

A patterned mask layer 110 is formed over the stack 104, as shown in FIG. 3A. The patterned mask layer 110 may be a patterned photoresist layer or a patterned hard mask layer. The patterned mask layer 110 has a rail-shaped profile in a top view. In specific, the patterned mask layer 110 has two strip portions extending in the X direction and multiple connecting portions between the strip portions and extending in the Y direction. An etching process is performed on the stack 104 using the patterned mask layer 110, as shown in FIG. 3B. The patterned mask layer 110 may be removed in the etching process or by an additional process. After the etching process, the stack 104 is formed into one or more patterned stacks 104, each of which has a rail-shaped profile in a top view. Each of the patterned stack 104 includes a first strip region 104E1, a second strip region 104E2 and multiple connecting regions 104C. The first strip region 104E1 and the second strip region 104E2 extend in the X direction, and the connecting regions 104C extend in the Y direction and connect the first strip region 104E1 to the second strip region 104E2. The spaces defined between the first strip region 104E1, the connecting regions 104C and the second strip region 104E2 are denoted as 112.

Figures 1, 3C:
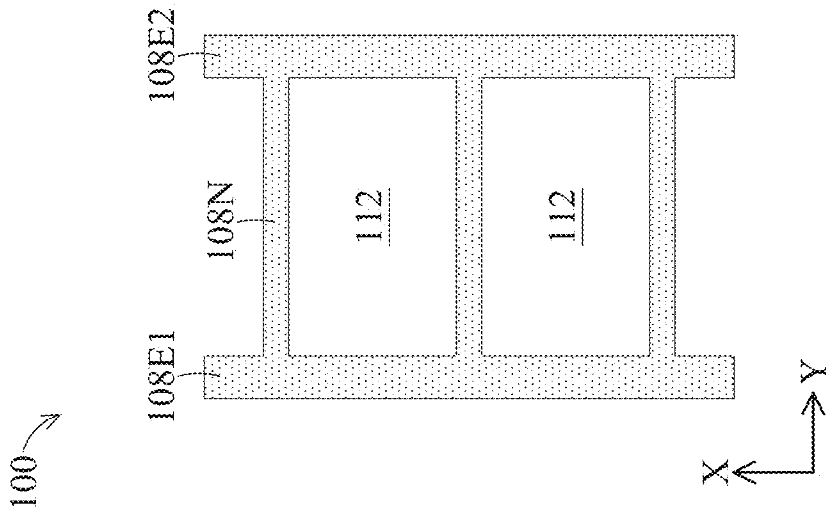
Figures 2, 3C:
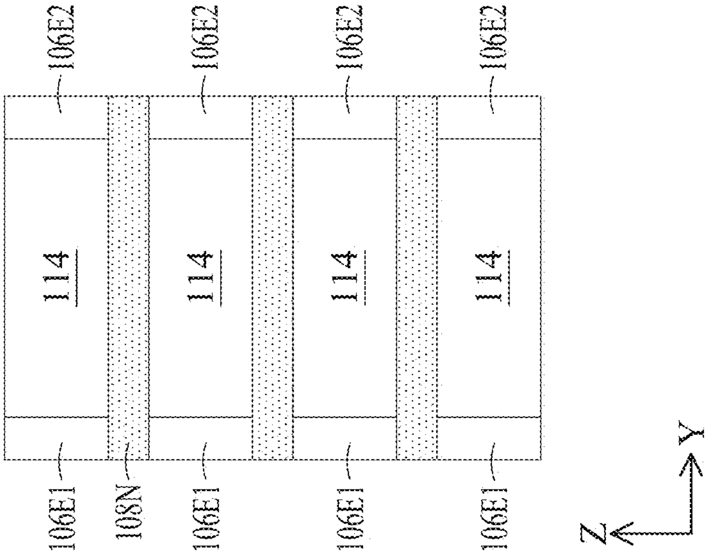
Figures 3, 3C:
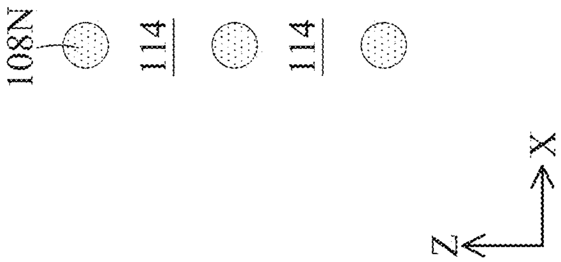
Figures 3, 3D:
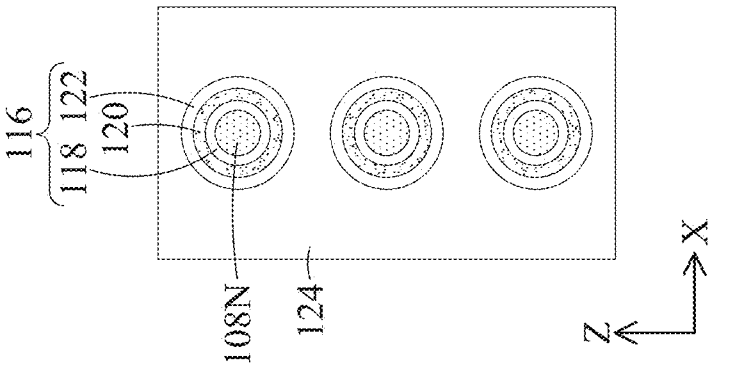
Figures 2, 3D:
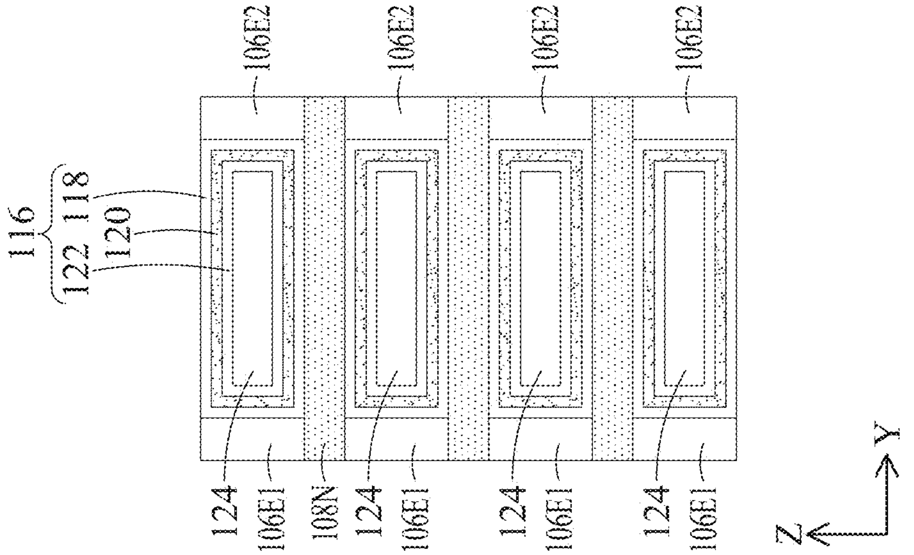
Figures 1, 3D:
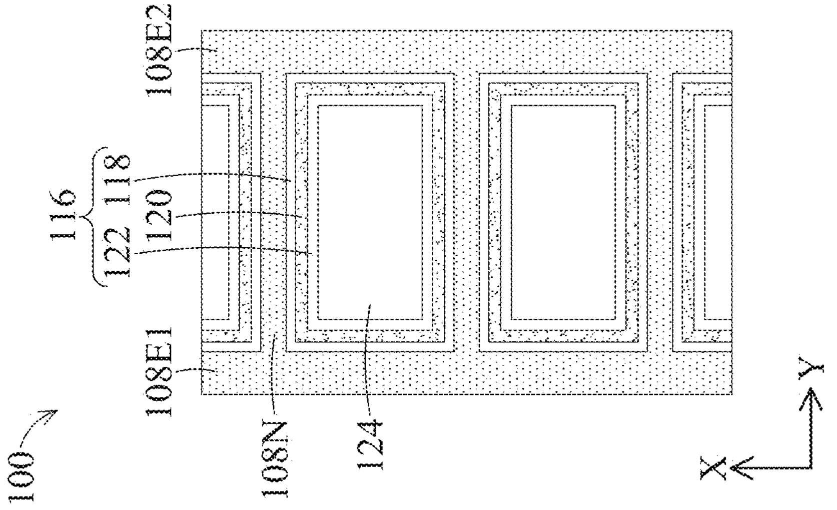

A patterning process is performed to remove the portions of the sacrificial layers 106 in the connecting regions 104C, thereby forming gaps 114, as shown in FIGS. 3C-2 and 3C-3. The patterning process includes forming a patterned mask layer (e.g., a patterned photoresist layer or a patterned hard mask layer) to cover the strip regions 104E1 and 104E2, and followed by an etching process (e.g., isotropic etching process) to selectively remove the sacrificial layers 106 in the connecting regions 104C.

After the patterning process, the four main surfaces of portions of the channel layers 108 in the connecting region 104C are exposed from the spaces 112 and gaps 114, and are referred to as nanowires 108N. The nanowires 108N may be shaped with cylindrical profiles using an additional trimming process.

Portions of the sacrificial layers 106 and the channel layers 108 in the strip region 104E1 are respectively denoted as 106E1 and 108E1, and portions of the sacrificial layers 106 and the channel layers 108 in the strip region 104E2 are respectively denoted as 106E2 and 108E2.

A memory film 116 and a gate electrode layer 124 are sequentially formed over the semiconductor memory device 100, as shown in FIGS. 3D-1, 3D-2 and 3D-3. The memory film 116 wraps around the nanowires 108N and partially fills the spaces 112 and the gaps 114. The memory film 116 includes a first oxide layer 118, a nitride layer 120 formed on the first oxide layer 118, and a second oxide layer 122 formed on the nitride layer 120. The first oxide layer 118 is formed along the nanowires 108N, the channel layers 108E1 and 108E2 and the sacrificial layers 106E1 and 106E2. The first oxide layer 118 and the second oxide layer 122 are made of silicon oxide, and the nitride layer 120 is made of silicon nitride.

The gate electrode layer 124 is formed over the memory film 116 and overfills the remainder of the spaces 112 and the remainder of the gaps 114. The gate electrode layer 124 is made of a conductive material (e.g., metal or metal nitride such as Ru, W, Co, Mo, Al, Cu, TiN, TaN, etc.).

Figures 1, 3E:
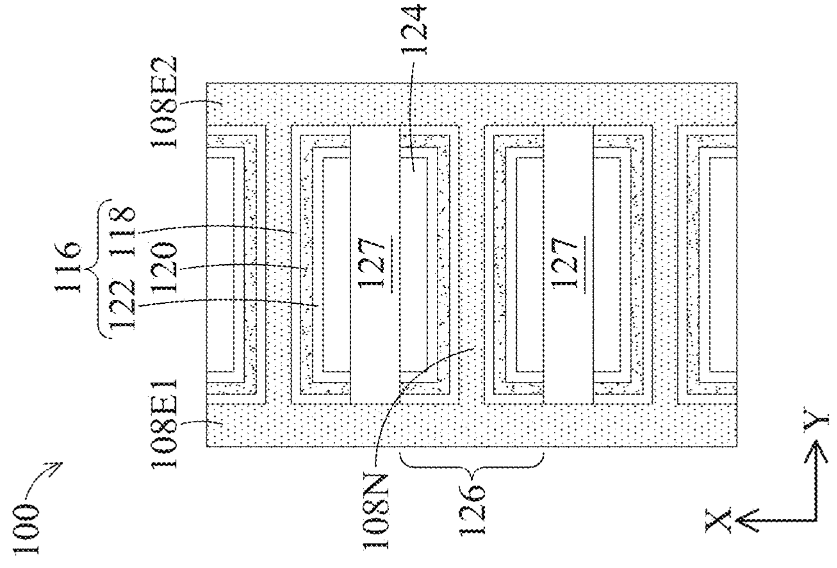
Figures 2, 3E:
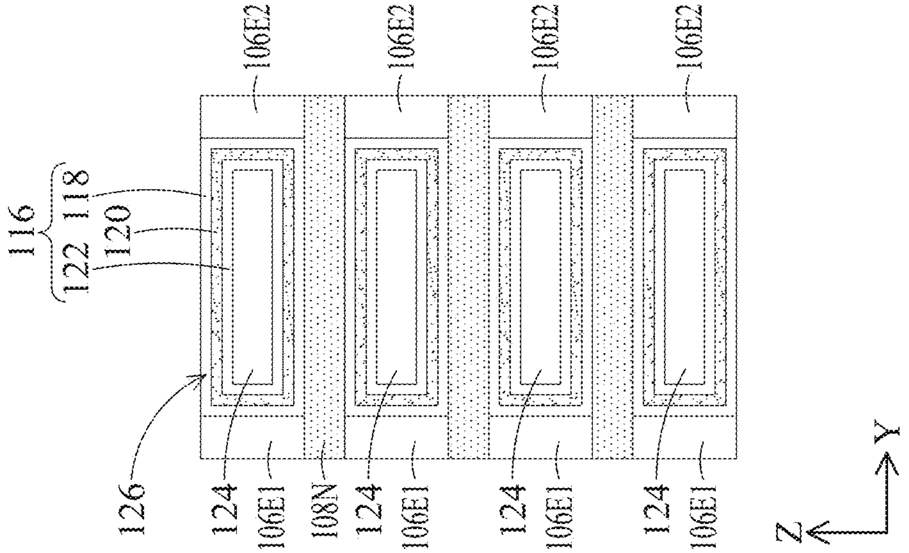
Figures 3, 3E:
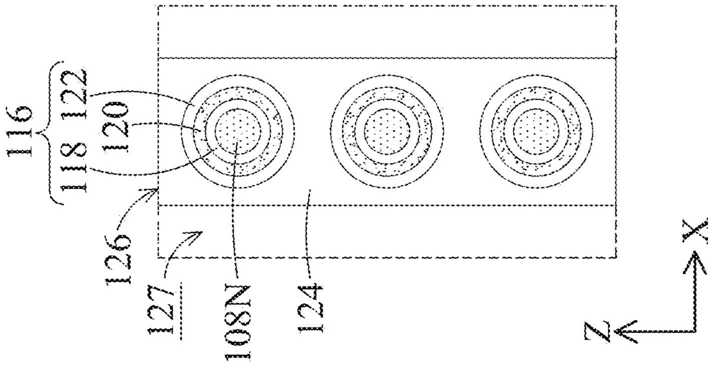

A patterning process is performed on the gate electrode layer 124 and the memory film 116 to form trenches 127, as shown in FIGS. 3E-1 and 3E-3. The patterning process may include photolithography and etching processes. The trenches 127 and the nanostructures 108N are alternatingly arranged in the X direction. Alternatively, the trenches 127 may be arranged to skip two or more nanostructures 108N at a time. The trenches 127 expose the channel layers 108E1 and 108E2 and the sacrificial layers 106E1 and 106E2 in the strip regions. The gate electrode layer 124 and the memory film 116 are cut through by the trenches 127 into several segments that are electrically isolated from one another. The gate electrode layer 124 and the memory film 116 in each segment combine to form a gate structure 126.

Figures 3, 3F:
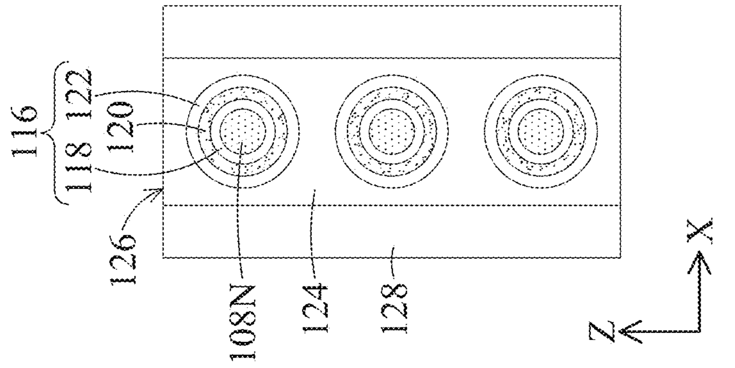
Figures 2, 3F:
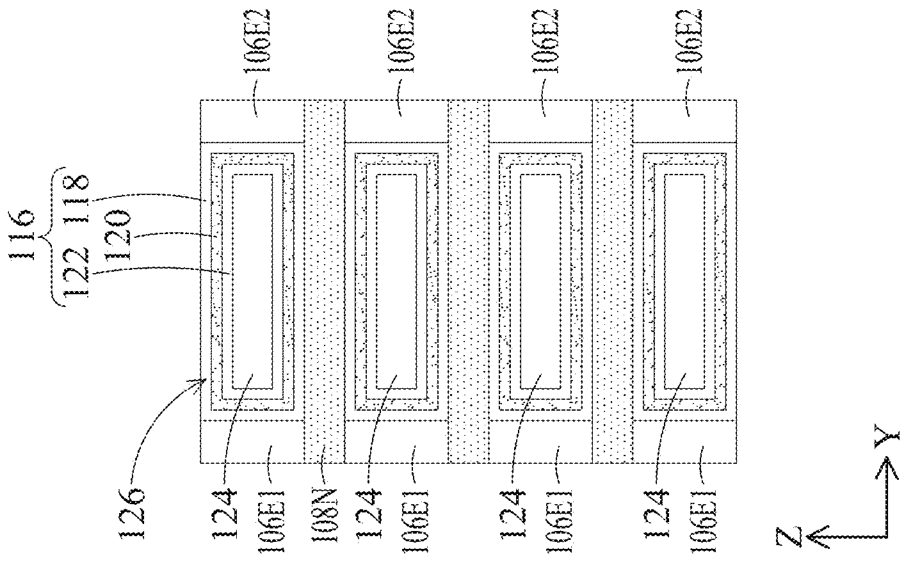
Figures 1, 3F:
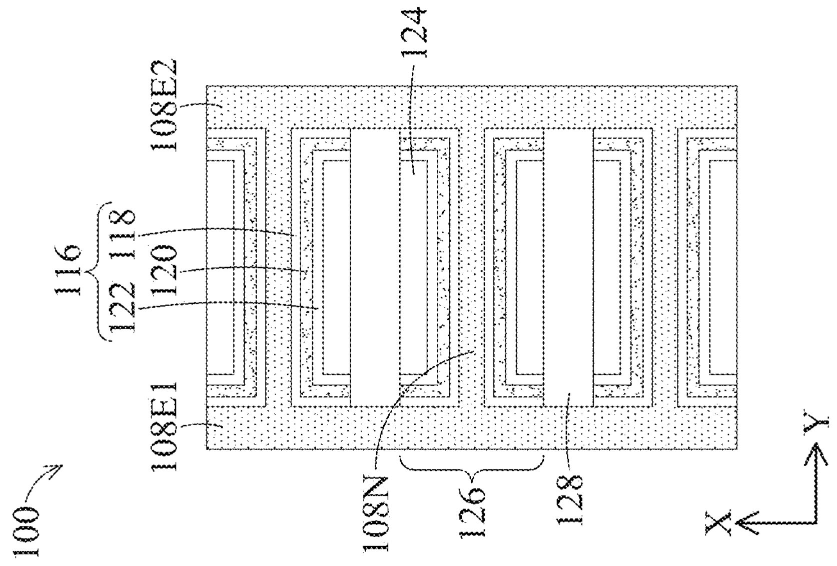

A dielectric layer 128 is formed to fill the trenches 127, as shown in FIGS. 3F-1 and 3F-3. The dielectric layer 128 may be made of dielectric material such as silicon oxide (SiO), silicon nitride (SiN), silicon oxynitride (SiON), or a combination thereof.

Figures 2, 3G:
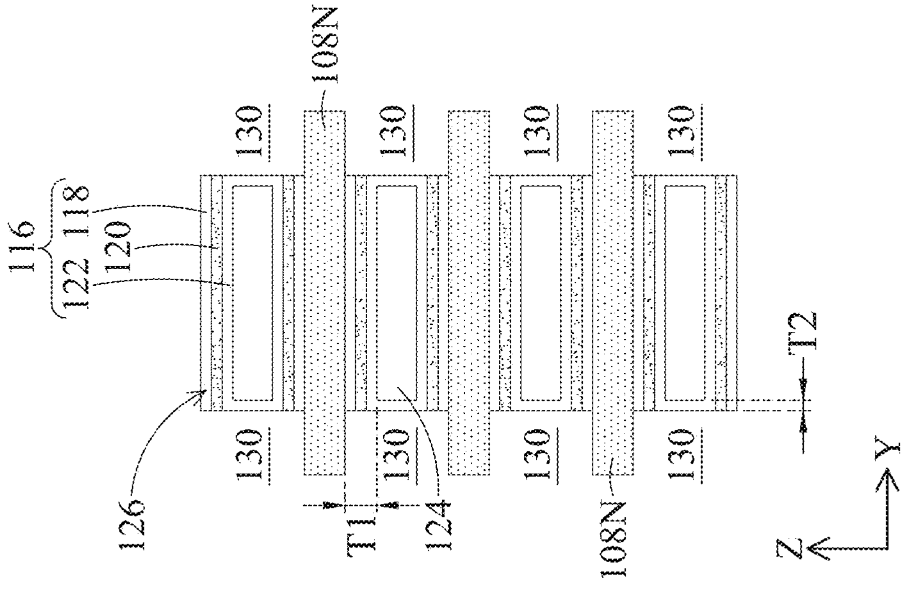
Figures 1, 3G:
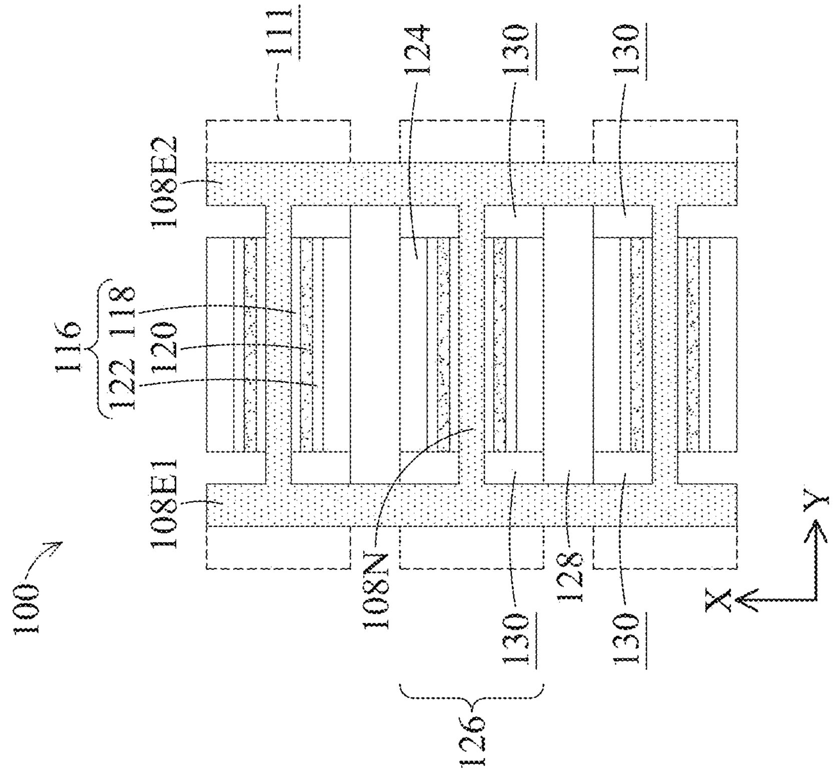

A patterning process using photolithography and etching process is then performed on portions (not shown) of semiconductor memory device 100 between neighboring two patterned stacks 104 to open slots 111 beside the channel layers 108E1 and 108E2 and sacrificial layers 106E1 and 106E2, not overlapping the dielectric layer 128, on the side where there are no gate electrode layers 124 defined. A lateral etching process (e.g., using dilute hydrofluoric acid) is performed to remove the sacrificial layers 106E1 and 106E2 in the strip regions, thereby forming gaps 130 that expose the memory films 116, as shown in FIG. 3G-2. Care should be taken that the dielectric layer 128 is etched laterally minimally during this process.

Afterward, a lateral etching process (e.g., using dilute hydrofluoric acid) is performed to etch away the first oxide layer 118 and the nitride layer 120 (e.g., using hot phosphoric acid) from the gaps 130 until the second oxide layer 122 of the memory films 116 is exposed, as shown in FIG. 3G-2. Again, care should be taken that the dielectric layer 128 is etched laterally minimally during this process.

The nitride layer 120 was originally a continuous extension layer surrounding the vertical stack of the multiple nanowires 108N. It is now cut into multiple nitride layers 120, each nitride layer surrounding the corresponding nanowire 108N and is not connected to each other. Therefore, the carriers injected into the memory film 116 will be confined around the corresponding nanowires 108N and cannot move to other adjacent nanowires 108N. Therefore, the risk of the charge leak may be reduced, and the capability of data retention may be thus improved.

In addition, a memory cell contains multiple channels, and each channel is surrounded by a charge storage area (e.g., memory film). As a result, each memory cell has multiple charge storage locations for data access, so the memory cells are less likely to be negatively affected by the defects in the memory films. Therefore, the reliability of the resulting semiconductor memory device may be improved.

The memory film 116 has a horizontal portion between the nanowires 108N and the gate electrode layer 124, having a thickness T1 in the Z direction, as shown in FIG. 3G-2. The memory film 116 has a vertical portion along the sidewalls of the gate electrode layer 124, having a thickness T2 in the Y direction, as shown in FIG. 3G-2. The thickness T1 is greater than the thickness T2. In the other words, the horizontal portion of the memory film 116 has a greater number of layers than the vertical portion of the memory film 116 (e.g., two more layers).

Figures 2, 3H:
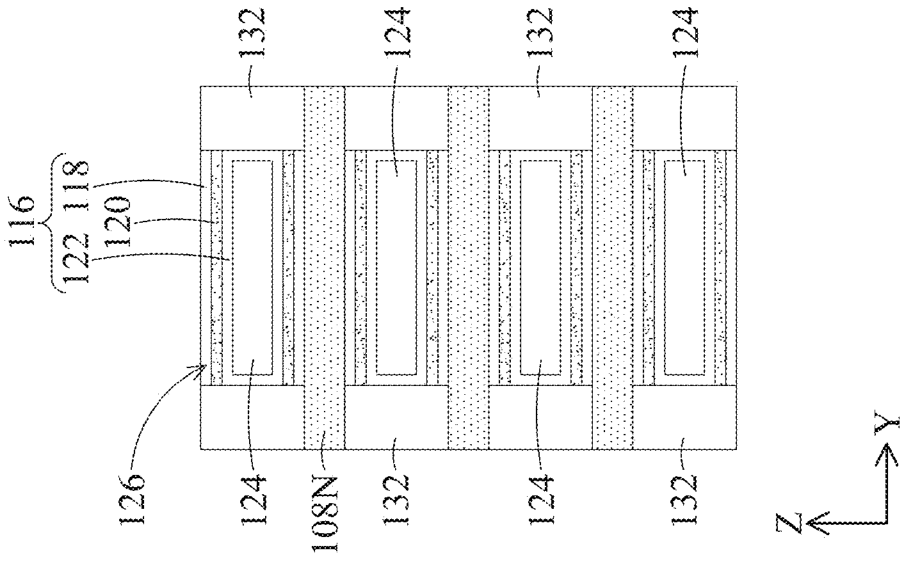
Figures 1, 3H:
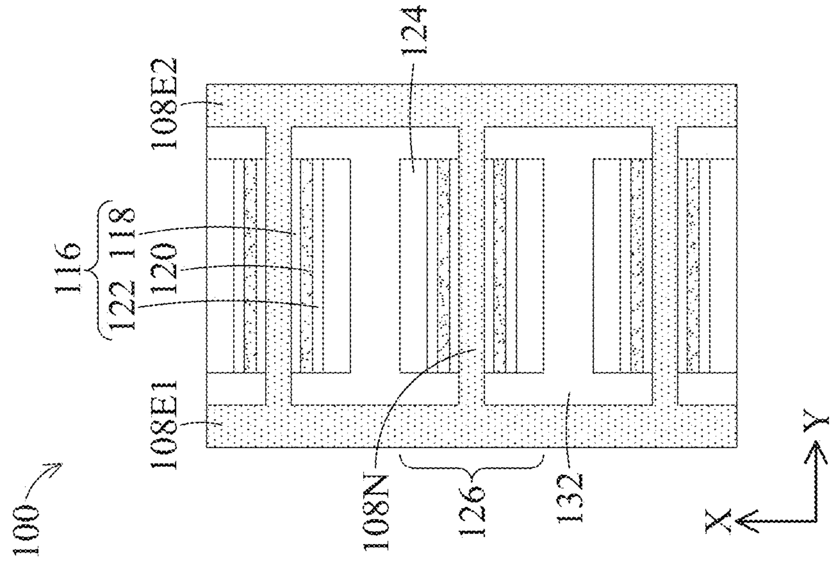

A dielectric layer is formed to fill the gaps 130, and together with the dielectric layer 128 is collectively referred to as an isolation structure 132, as shown in FIGS. 3H-1 and 3H-2. The dielectric layer filled in the gap 130 may be the same material as the dielectric layer 128, such as silicon oxide (SiO), silicon nitride (SiN), silicon oxynitride (SiON), or a combination thereof. The isolation structure 132 is in direct contact with the first oxide layers 118, the nitride layers 120 and the second oxide layers 122 of the memory films 116.

Figures 2, 3I:
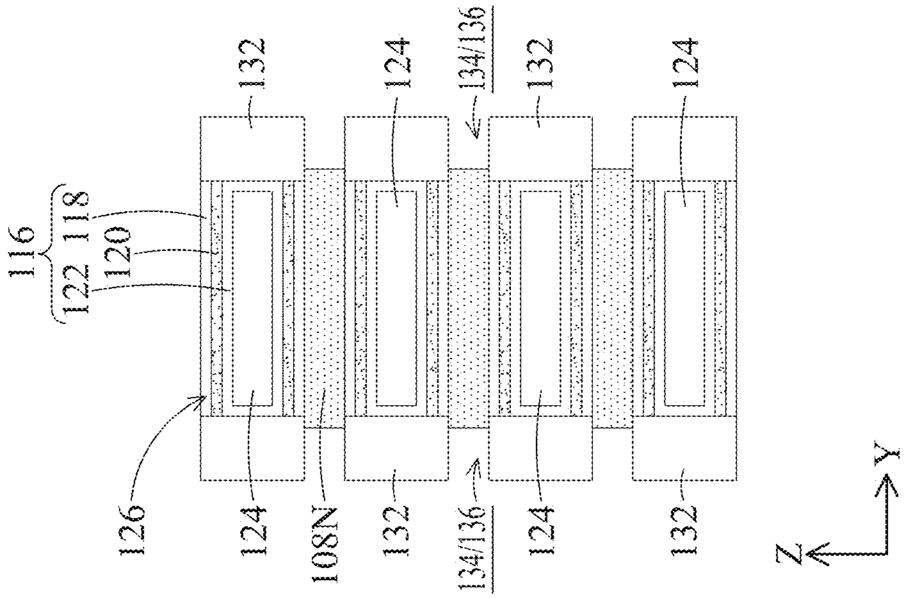
Figures 1, 3I:
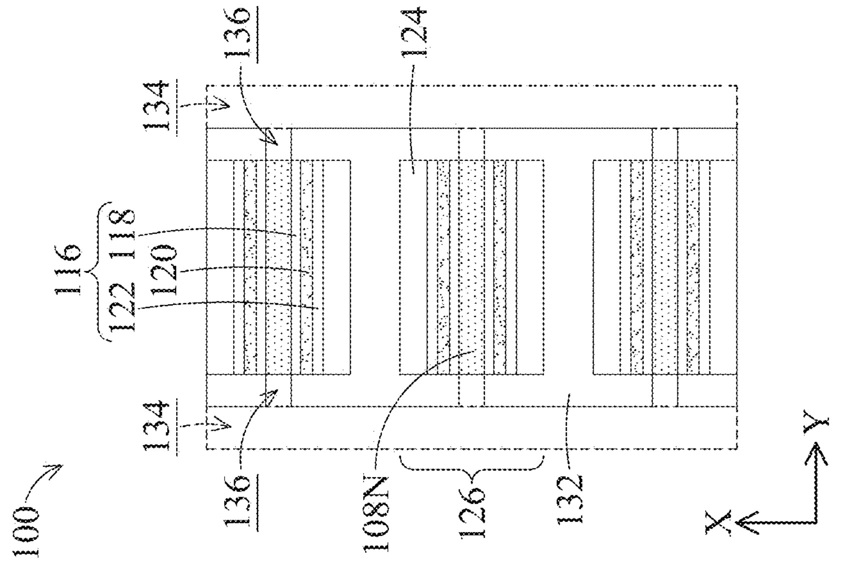

A lateral etching process (e.g., isotropic etching) is performed to remove the channel layers 108E1 and 108E2 in the strip regions, thereby forming gaps 134, as shown in FIGS. 3I-1 and 3I-2. A lateral etching process (e.g., isotropic etching) is then performed to recess the nanowires 108N, thereby forming notches 136.

Figures 2, 3J:
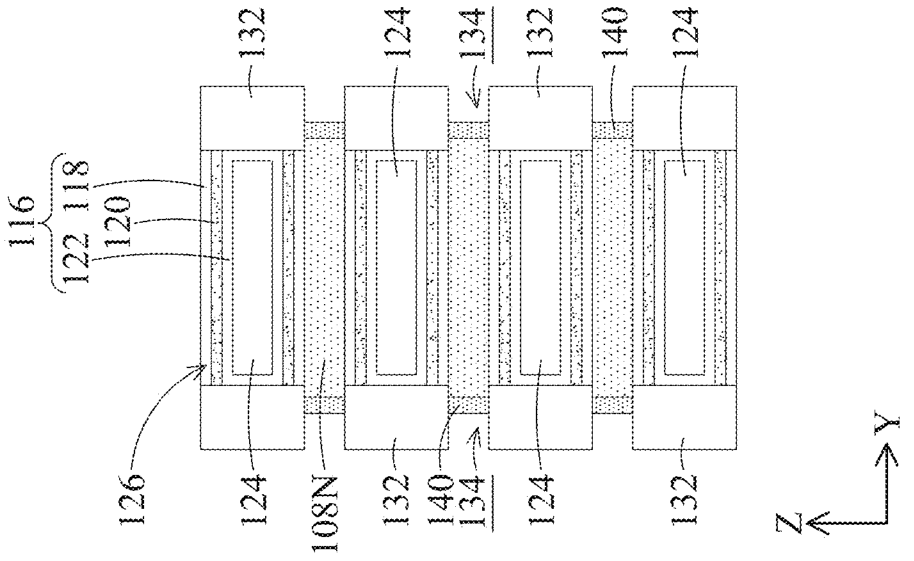
Figures 1, 3J:
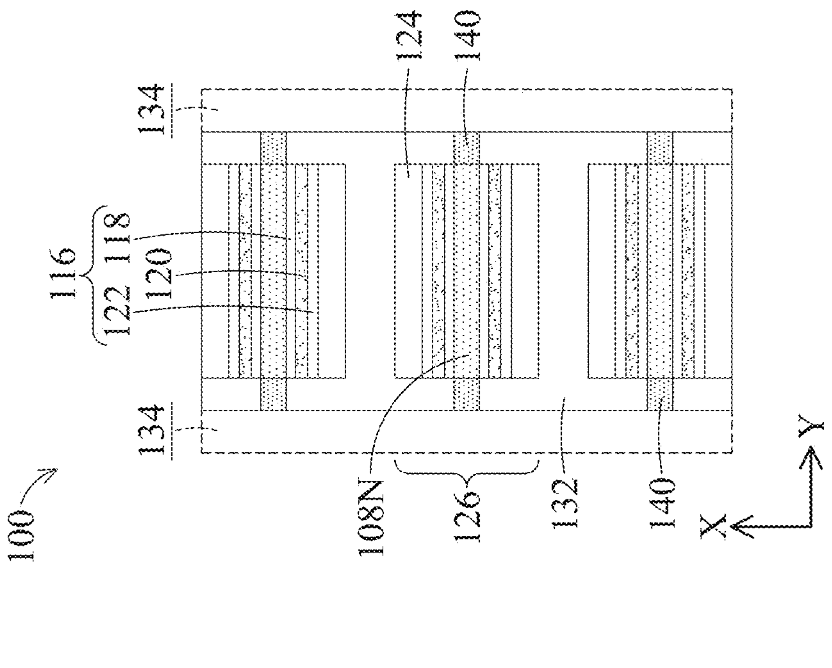

Source/drain regions 140 are formed in the notches 136, as shown in FIGS. 3J-1 and 3J-2. In some embodiments, the source/drain regions 140 may be made of doped semiconductor material (such as silicon) with n-type or p-type dopants, which are formed using an epitaxial growth process with in-situ doping. The doped semiconductor material may be first deposited to fill the gaps 134 and the notches 136, and then removed from the gaps 134 using an etching process. The remaining portion of the doped semiconductor material in the notches 136 serves as the source/drain regions 140. The nanowires 108N, the gate structures 126 (including the memory films 116 and the gate electrode layer 124) and the source/drain regions 140 combine to form GAA transistors.

Figures 3, 3K:
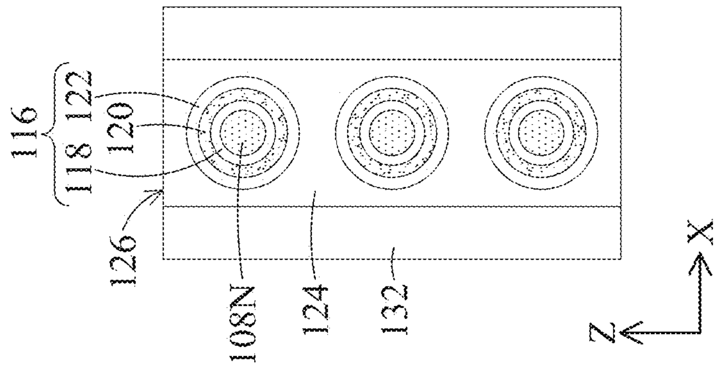
Figures 2, 3K:
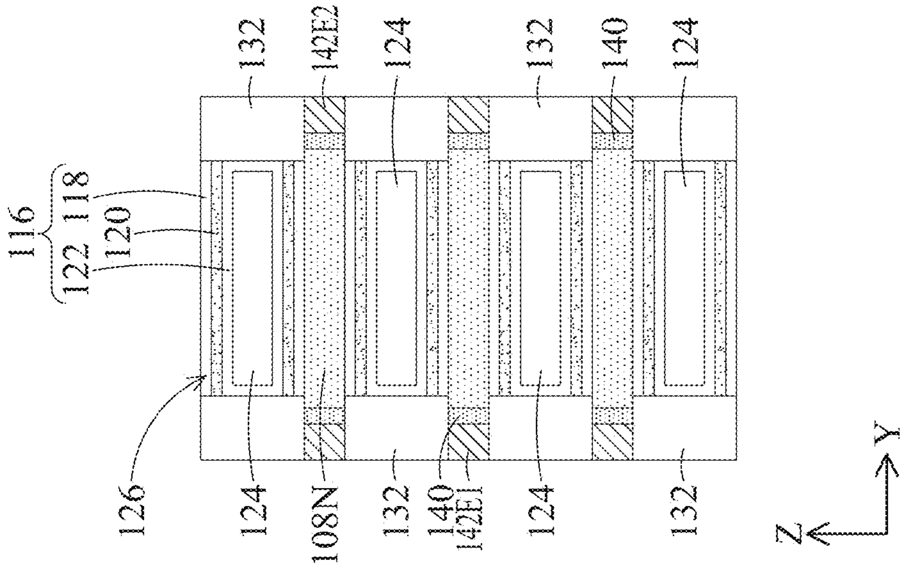
Figures 1, 3K:
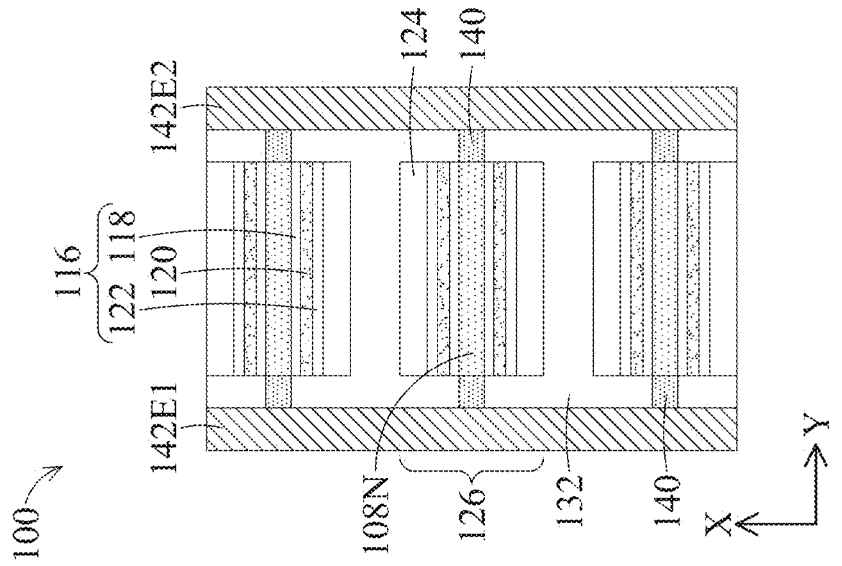

The conductive lines 142 (including 142E1 and 142E2) are formed in the gaps 134, as shown in FIGS. 3K-1 and 3K-2. The conductive lines 142 are electrically connected to the source/drain regions 140. In some embodiments, the silicide layer (e.g., CoSi) may be formed between the conductive lines 142 and the source/drain regions 140. In some embodiments, the conductive lines 142E1 and 142E2 are made of metal material (such as W, Al, Cu, Co, or Ru), or metal nitride (such as TiN or TaN), or a combination thereof.

In some embodiments, the upper surfaces of the conductive lines 142E1 and 142E2, the upper surfaces of the source/drain regions 140 and the upper surfaces of the nanowires 108N in the same level are substantially level. In some embodiments, the bottom surfaces of the conductive lines 142E1 and 142E2, the bottom surfaces of the source/drain regions 140 and the bottom surfaces of the nanowires 108N in the same level are substantially level, as shown in FIG. 3K-2.

FIGS. 3L-3O are cross-sectional views of the semiconductor memory device 100 illustrating the formation of conductive vias 154. FIGS. 3L-3O correspond to cross-section X2-X2 in FIG. 3B, in accordance with some embodiments.

Figure 3L:
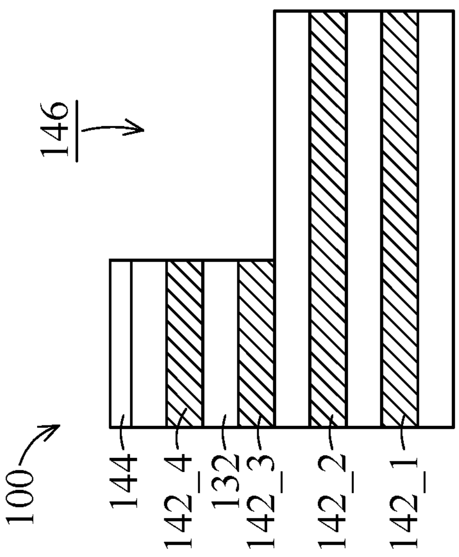

A patterned mask layer 144 (e.g., a patterned photoresist layer or a patterned hard mask layer) is formed over the semiconductor memory device 100, as shown in FIG. 3L. The conductive lines 142_1 to 142_4 shown in FIG. 3L may be the conductive lines 142E1 or the conductive lines 142E2 discussed above. An etching process is performed on the semiconductor memory device 100 using the patterned mask layer 144 to form a recess 146. The patterned mask layer 144 may be removed in the etching process or by an additional process. The recess 146 cuts through two conductive lines 142_3 and 142_4.

Figure 3M:
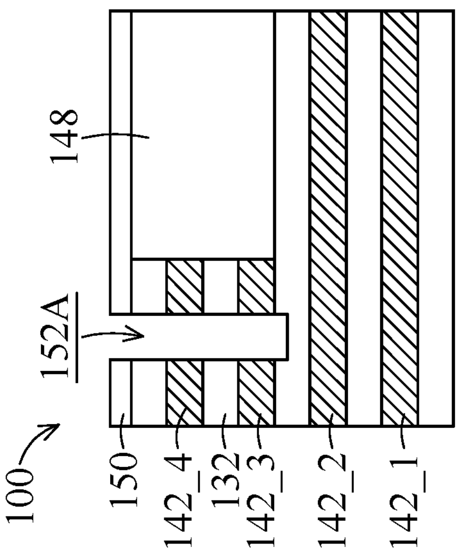

A dielectric layer 148 is formed to fill the recess 146, as shown in FIG. 3M. In some embodiments, the dielectric layer 124 may be made of silicon oxide (SiO), silicon nitride (SiN), silicon oxynitride (SiON), or a combination thereof. A patterned mask layer 150 (e.g., a patterned photoresist layer or a patterned hard mask layer) is formed over the semiconductor memory device 100, as shown in FIG. 3M. An etching process is performed on the semiconductor memory device 100 using the patterned mask layer 150 to form a via hole 152A. The via hole 152A penetrates through the conductive lines 142_3 and 142_4. The patterned mask layer 150 may be removed in the etching process or by an additional process.

Figure 3N:
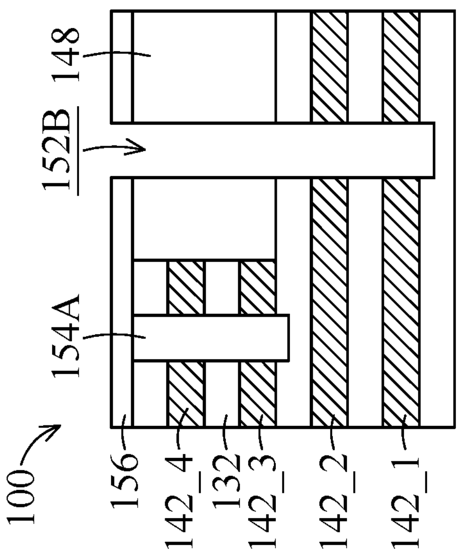
Figure 3O:
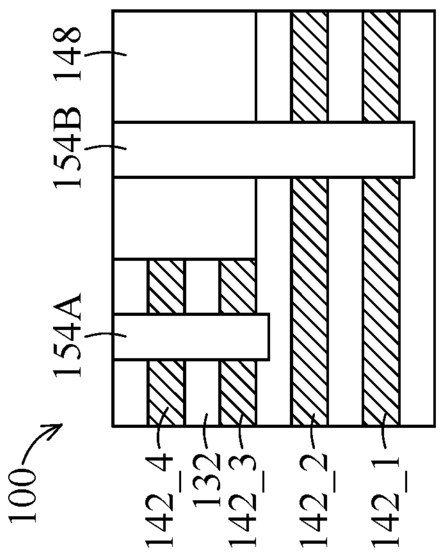

A conductive via 154A is formed in the via hole 152A, as shown in FIG. 3N. In some embodiments, the conductive via 154A is made of metal material (such as W, Al, Cu, Co, or Ru), or metal nitride (such as TiN or TaN), or a combination thereof. A patterned mask layer 156 (e.g., a patterned photoresist layer or a patterned hard mask layer) is formed over the semiconductor memory device 100, as shown in FIG. 3N. An etching process is performed on the semiconductor memory device 100 using the patterned mask layer 156 to form a via hole 152B. The via hole 152B penetrates through the dielectric layer 148 and underlying two conductive lines 142_1 and 142_2. The patterned mask layer 156 may be removed in the etching process or by an additional process.

A conductive via 154B is formed in the via hole 152B, as shown in FIG. 3O. In some embodiments, the conductive via 154B may be made of the same metal material as the conductive via 154A. Conductive lines 142_3 and 142_4 are electrically connected to each other through conductive via 154A, thereby forming vertically grouped conductive lines. Conductive lines 142_1 and 142_2 are electrically connected to each other through conductive via 154B, thereby forming other vertically grouped conductive lines.

It should be understood that the semiconductor structure 100 may undergo further conventional processing to form various features over the semiconductor structure. For example, conductive lines (e.g., word lines) may be formed over the GAA transistors and are electrically connected to the gate structures 126.

FIGS. 4A-1 through 4C-3 are schematic diagrams illustrating the formation of a semiconductor memory device 200 at various intermediate stages. The semiconductor memory device 200 is similar to the semiconductor memory device 100 of FIGS. 2 and 3A through 3O except that the memory film 116 further includes a metal layer.

Continuing from FIGS. 3C-1 to 3C-3, a memory film 116 and a gate electrode layer 124 are sequentially formed over the semiconductor memory device 200, as shown in FIGS. 4A-1, 4A-2 and 4A-3. The memory film 116 further includes a metal layer 202 formed on the first oxide layer 118 and a third oxide layer 204 formed on the metal layer 202. The nitride layer 120 is formed on the third oxide layer 204. The metal layer 202 is made of Ru, W, Co, Mo, Al or Cu. In some embodiments, the metal layer 202 functions as a floating gate for the semiconductor memory device. The third oxide layer 204 is made of silicon oxide.

Figures 1, 4A:
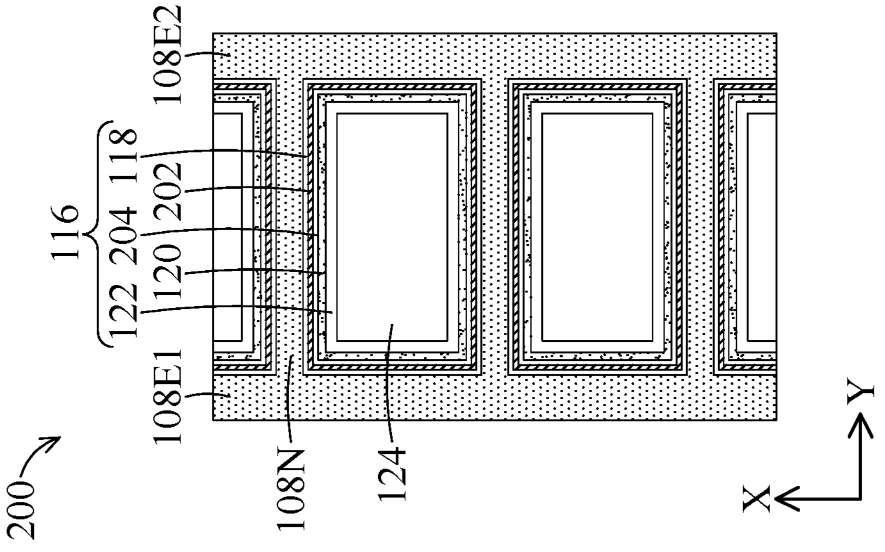
Figures 2, 4A:
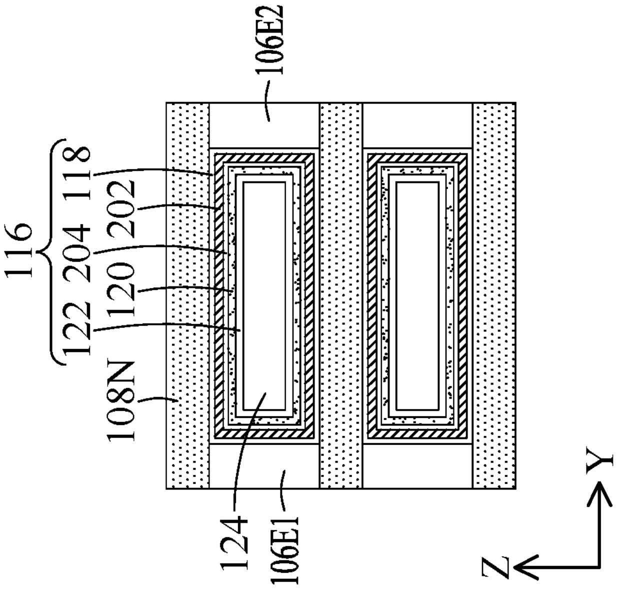
Figures 3, 4A:
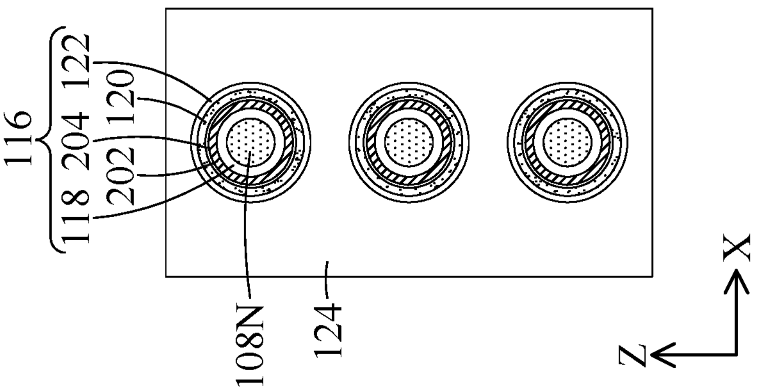
Figures 2, 4B:
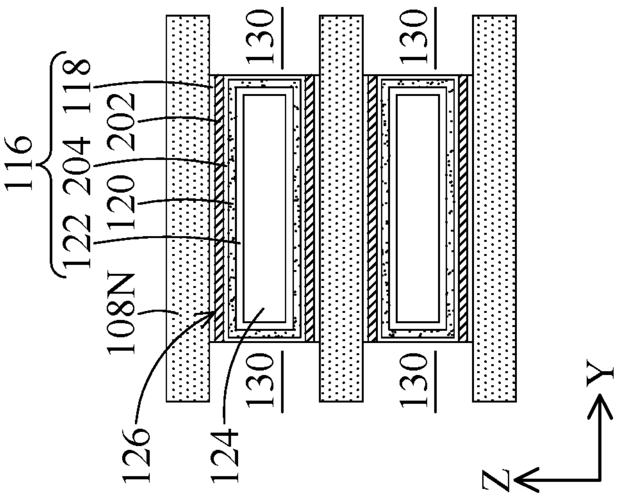
Figures 1, 4B:
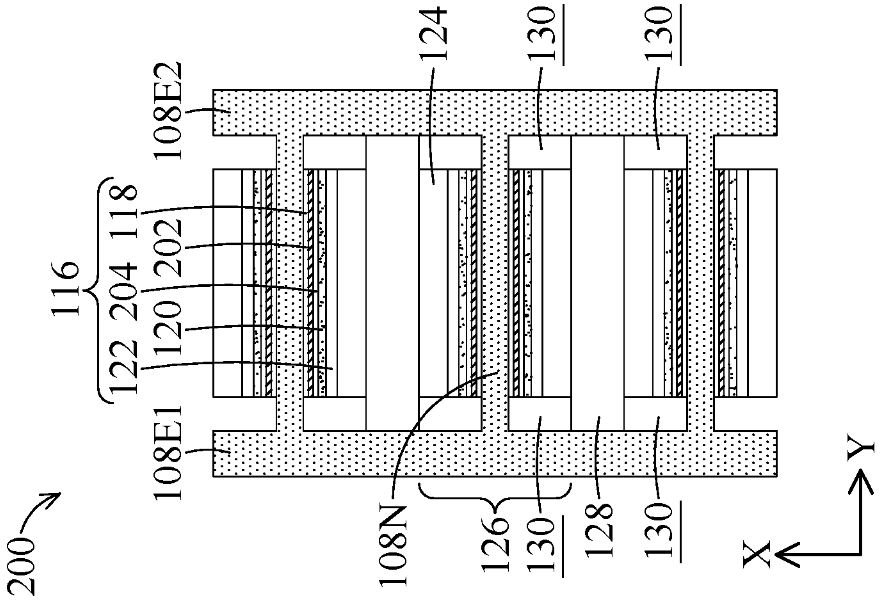

The steps described above in FIGS. 3E-1 through 3G-2 are performed on the semiconductor memory device 200, thereby forming the gate structures 126, the dielectric layer 128, and the gaps 130, as shown in FIGS. 4B-1 and 4B-2. The first oxide layer 118 and the metal layer 202 are etched away from the gaps 130 until the third oxide layer 204 of the memory films 116 is exposed, as shown in FIG. 4B-2.

The metal layer 202 was originally a continuous extension layer surrounding the vertical stack of the multiple nanowires 108N. It is now cut into multiple metal layer 202, each metal layer surrounding the corresponding nanowire 108N and is not connected to each other. Therefore, the carriers injected into the memory film 116 will be confined around the corresponding nanowires 108N and cannot move to other adjacent nanowires 108N. Therefore, the risk of the charge leak may be reduced, and the capability of data retention may be thus improved.

Figures 1, 4C:
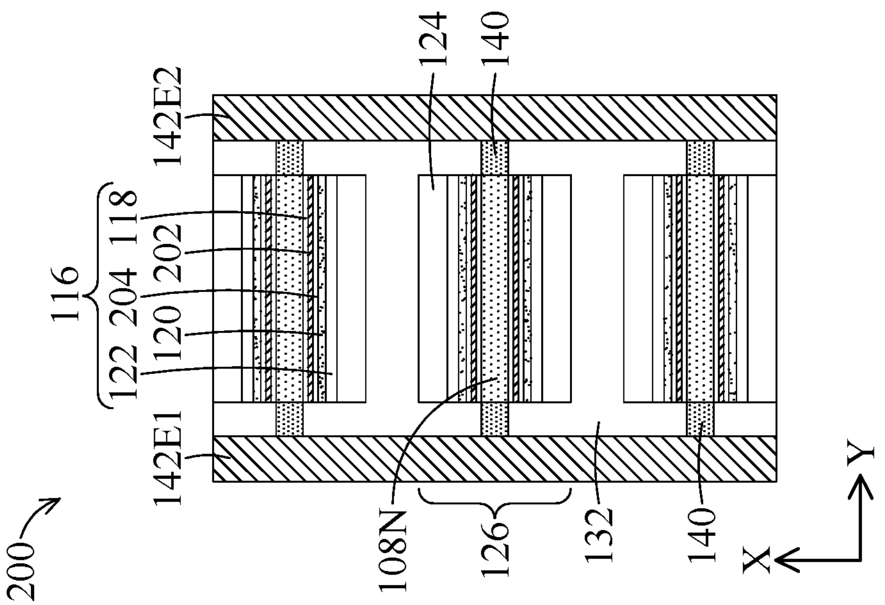
Figures 2, 4C:
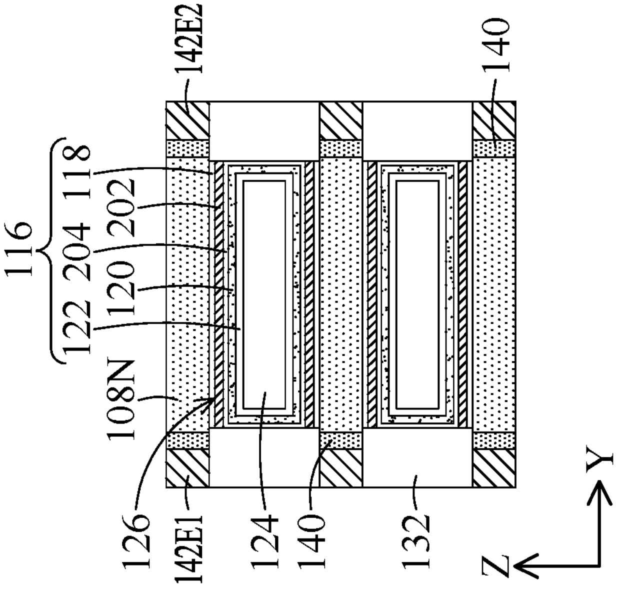
Figures 3, 4C:
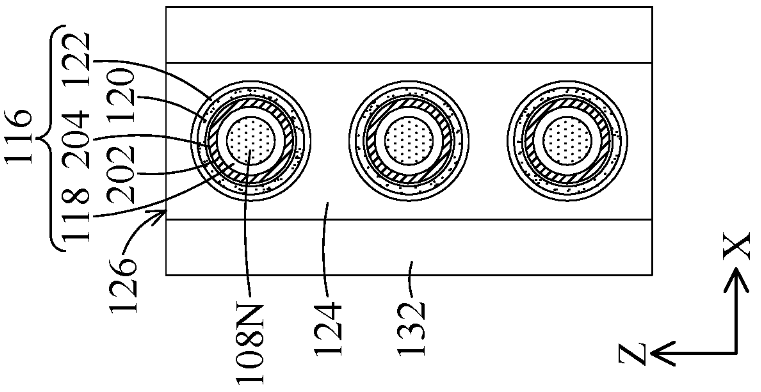

The steps described above in FIGS. 3H-1 through 3K-3 are performed on the semiconductor memory device 200, thereby forming the isolation structure 132, the source/drain regions 140, the conductive lines 142 (including 142E1 and 142E2), as shown in FIG. 4C-1 to 4C-3. The isolation structure 132 is in direct contact with the first oxide layers 118, the metal layers 202 and the third oxide layers 204 of the memory films 116. Afterward, the steps described above in FIGS. 3L to 3O are performed on the semiconductor memory device 200, thereby forming conductive vias (not shown).

As described above, the embodiments of the present disclosure provide an architecture for a three-dimensional semiconductor memory device (e.g., NOR-type flash memory). The memory cells of the semiconductor memory device include GAA transistors, each of GAA transistors including at least two nanowires, which may increase the on-state current and mitigate the negative affect caused by the defects in the memory films. In addition, the nitride layer or the floating gate of the memory films is laterally cut. Therefore, the risk of the charge leak may be reduced, and the capability of data retention may be thus improved.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising:
- a plurality of nanowires vertically stacked over a substrate;
- a plurality of memory films, wherein each memory film of the plurality of memory films wraps around a corresponding nanowire of the plurality of nanowires and includes at least two dielectric layers;
- a gate electrode layer surrounding the plurality of memory films;
- an isolation structure encapsulating the gate electrode layer, wherein the isolation structure is in direct contact with the gate electrode layer and the at least two dielectric layers of the memory films;
- a plurality of first conductive lines vertically stacked over the substrate and electrically coupled to first ends of the plurality of nanowires, respectively; and
- a plurality of second conductive lines vertically stacked over the substrate and electrically coupled to second ends of the plurality of nanowires, respectively.

2. The semiconductor memory device as claimed in claim 1, wherein the at least two dielectric layers are a silicon oxide layer and a silicon nitride layer.

3. The semiconductor memory device as claimed in claim 1, wherein the plurality of first conductive lines forms a group of source lines comprising at least two source lines that are electrically connected to each other through a conductive via.

4. The semiconductor memory device as claimed in claim 1, wherein the plurality of second conductive lines forms a group of drain lines comprising at least two drain lines that are electrically connected to each other through a conductive via.

5. The semiconductor memory device as claimed in claim 1, further comprising:
- first source/drain regions sandwiched between the plurality of first conductive lines and the first ends of the plurality of nanowires; and
- second source/drain regions sandwiched between the plurality of second conductive lines and the second ends of the plurality of nanowires.

6. The semiconductor memory device as claimed in claim 5, wherein a top surface of each of the first source/drain regions is substantially level with a top surface of the corresponding first conductive line, and a bottom surface of each of the first source/drain regions is substantially level with a bottom surface of the corresponding first conductive line.

7. The semiconductor memory device as claimed in claim 1, wherein each of the memory films further includes a metal layer, wherein the metal layer is sandwiched between the at least two dielectric layers of the memory film and in direct contact with the isolation structure.

8. A semiconductor memory device, comprising:
- a first column of memory transistors stacked in a vertical direction, wherein each of the memory transistors in the first column comprises at least two nanowires, and the nanowires of the memory transistors are stacked in respective levels;
- a second column of drain lines stacked in the respective levels in the vertical direction, wherein the drain lines in the second column are divided into groups, each of the groups of drain lines comprises at least two drain lines that are electrically coupled to the at least two nanowires of a corresponding memory transistor; and
- a plurality of conductive vias corresponding to the groups of drain lines, respectively, wherein each of the conductive vias penetrates through the at least two drain lines in a corresponding one of the groups of drain lines, and the at least two drain lines in each group are electrically connected through a corresponding one of the conductive vias.

9. The semiconductor memory device as claimed in claim 8, further comprising:
- a third column of source lines stacked in the respective levels in the vertical direction, wherein the first column of memory transistors is sandwiched between the second column of drain lines and the third column of source lines.

10. The semiconductor memory device as claimed in claim 9, wherein the source lines in the third column are divided into groups, each of the groups of source lines comprises at least two source lines that are electrically coupled to the at least two memory nanowires of the corresponding memory transistor, and the at least two source lines in each group are electrically connected to each other.

11. The semiconductor memory device as claimed in claim 8, wherein:
- each of the memory transistors in the first column comprises a plurality of memory films and a gate electrode layer over the plurality of memory films, wherein each of the at least two nanowires of the memory transistor is surrounded by a corresponding one of the plurality of memory films,
- each of the memory films includes at least three layers, and has a vertical portion along a sidewall of the gate electrode layer and a horizontal portion between the gate electrode layer and a corresponding nanowire, and
- the horizontal portion of the memory film has a greater number of layers than the vertical portion of the memory film.

12. The semiconductor memory device as claimed in claim 8, wherein the nanowires extend in a first horizontal direction, and the drain lines extend in a second horizontal direction that is perpendicular to the first horizontal direction.

13. The semiconductor memory device as claimed in claim 12, further comprising:
- a word line above the first column of memory transistors, wherein the word line extends in the first horizontal direction and is electrically coupled to the memory transistors in the first column.

14. The semiconductor memory device as claimed in claim 8, wherein one of the conductive vias penetrates through all drain lines in a corresponding one of the groups of drain lines.

15. A method for forming the semiconductor memory device of claim 1, comprising:
- forming a stack of alternating channel layers and sacrificial layers, wherein the stack includes a first strip region, a second strip region and a connecting region connecting the first strip region and the second strip region;
- removing portions of the sacrificial layers in the connecting region;
- forming a memory film to surround portions of the channel layers in the connecting region;
- forming a gate electrode layer to surround the memory film;
- removing portions of the sacrificial layers in the first strip region and the second strip region to form gaps exposing the memory film;
- partially removing, from the gaps, the memory film; and
- replacing portions of the channel layers in the first strip region and the second strip region with a plurality of conductive lines.

16. The method for forming the semiconductor memory device as claimed in claim 15, wherein forming the memory film comprises:
- depositing a first oxide layer;
- depositing a nitride layer over the first oxide layer; and
- depositing a second oxide layer over the nitride layer.

17. The method for forming the semiconductor memory device as claimed in claim 16, wherein partially removing, from the gaps, the memory film comprises:
- etching the first oxide layer and the nitride layer until the second oxide layer is exposed.

18. The method for forming the semiconductor memory device as claimed in claim 15, wherein the first strip region and the second strip region extend in a first horizontal direction, and the connecting region extends in a second horizontal direction that is perpendicular to the first horizontal direction.

19. The method for forming the semiconductor memory device as claimed in claim 15, further comprising:
- forming a first conductive via through first and second conductive lines in the plurality of conductive lines.

* * * * *